United States Patent
Zhang et al.

(10) Patent No.: US 9,305,869 B1
(45) Date of Patent: Apr. 5, 2016

(54) PACKAGED SEMICONDUCTOR DEVICE HAVING LEADFRAME FEATURES AS PRESSURE VALVES AGAINST DELAMINATION

(71) Applicant: Texas Instruments Incorporated, Dallas, TX (US)

(72) Inventors: Rongwei Zhang, Dallas, TX (US); Abram Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/587,629

(22) Filed: Dec. 31, 2014

(51) Int. Cl.
*H01L 23/495* (2006.01)
*H01L 23/31* (2006.01)
*H01L 23/00* (2006.01)

(52) U.S. Cl.
CPC ...... *H01L 23/49513* (2013.01); *H01L 23/3107* (2013.01); *H01L 23/4952* (2013.01); *H01L 24/83* (2013.01)

(58) Field of Classification Search
CPC .............. H01L 23/49513; H01L 24/83; H01L 23/4952; H01L 23/3107
See application file for complete search history.

(56) References Cited

U.S. PATENT DOCUMENTS

2014/0048920 A1*  2/2014  Abbott ............. H01L 23/49541
257/676

\* cited by examiner

*Primary Examiner* — Roy Potter
*Assistant Examiner* — Paul Patton
(74) *Attorney, Agent, or Firm* — Steven A. Shaw; Frank D. Cimino

(57) ABSTRACT

A packaged semiconductor device (100) comprising a leadframe having a pad (101) with an assembled semiconductor chip (110), a plurality of straps (102) connecting the pad to side edges of the device package, leads (103), and a package (150) of plastic compound adhering to the leadframe; at least one surface (102a) of the straps covered with a layer (120) of a compound both non-adhesive to polymeric compounds and hydrophobic; the compound (220) selected from a group including fluorinated thiol compounds, fluorinated amine compounds, fluorinated aminesilanes, organosilanes, and their derivatives; or the compound (330) selected from a group including open-pore microcellular metal foams and polymer foams. Further, the package may include an array of holes through the plastic compound, extending from the package surface to the strap surface.

23 Claims, 3 Drawing Sheets

PACKAGED SEMICONDUCTOR DEVICE HAVING LEADFRAME FEATURES AS PRESSURE VALVES AGAINST DELAMINATION

FIELD

Embodiments of the invention are related in general to the field of semiconductor devices and processes, and more specifically to the structure and fabrication method of leadframes with chemical and metallurgical features acting as pressure valves against delamination of packaged semiconductor devices.

DESCRIPTION OF RELATED ART

Moisture-induced failures of plastic packaged semiconductor devices have been observed and investigated for many years. It is well known that plastic packages made, for instance, by epoxy-based molding compounds can be penetrated by discrete water molecules within a time period of about one day. However, this penetration does not lead to a problematic situation as long as there is good adhesion inside the package between the plastic compound and the device components (semiconductor chip, metallic leadframe, substrate, etc.), and the penetrated water molecules cannot accumulate to form films of water on free surfaces.

In contrast, when some interfacial delamination has happened and water films have been able to form, quick rises of temperature may vaporize the water and initiate expansive internal pressures between the components and the package material. The expansive pressure may be high enough to bulge the package material at thin spots and eventually cause a crack through the material of the package. As an example, the temperature may rise quickly beyond the water boiling point when the packaged device is heated in order to reflow the device solder balls for attaching the device to a board. In the literature, the phenomenon of local package cracking by steam pressure has been dubbed popcorn effect. With the observed device failures, the popcorn effect has been a frustrating reliability problem for many years.

A variety of methods have been tried to prevent device delamination and package cracking by enhancing adhesion between the different device components (package compound, semiconductor chip, substrate, leadframe, etc.). Among the efforts have been chemically purifying the molding compounds; activating leadframe metal surfaces, for instance by plasma, just prior to the molding process; enhancing the affinity of leadframe metals to polymeric compounds by oxidizing the base metal or by depositing special metal layers (such as rough tin); coining the leadframes for creating dimples and other three-dimensional surface features and roughness for improved interlocking of the package material with the surfaces of the enclosed parts. However, the success of all these efforts has only been partial and limited.

SUMMARY

The ongoing market trend of miniaturizing semiconductor devices seems to leave ever less area for enhancing adhesion between encapsulation compound and enclosed parts of a device, and thus for controlling delamination. Searching for a step-function improvement of this downward spiral, applicants realized that the problem of the expanding pressure caused by suddenly vaporizing water can be effectively deactivated by letting a portion of the package act like a valve for releasing the pressure in a harmless manner.

Applicants solved the package delamination and cracking problem when they discovered methods for incorporating suitable features into the substrate/compound system, which can act as short-time outlet valves without infringing on the function and reliability of the substrate/compound system.

In one method, the package obtains a small number of micro-holes laser-drilled between the surface of the package and the surface of an enclosed substrate portion, which is not involved in the electrical functions of the device. An embodiment is given by through-mold vias vertically drilled through the package compound to the straps anchoring the assembly pad of metallic leadframes. Exemplary holes may have a diameter in the range from about 20 µm to 100 µm, and may, for example, be aligned in an array of about 4 to 8 per strap.

Another embodiment is the low-cost method of depositing a thin layer onto a substrate part extending from the package center to a package sidewall surface. An example of such part is the strap holding the attachment pad. The material of the layer adheres to the part but does not adhere to the encapsulation compound; furthermore the material is hydrophobic.

Preferred examples of the material can be found in self-assembling monolayers of fluorocarbons, which have a hydrocarbon section adhering to the substrate and a fluorocarbon section not adhering to the encapsulation compound and acting hydrophobic. Exemplary materials include fluorinated thiol compounds and fluorinated amine compounds. The coating process of the parts can be accomplished by aerosol jet printing and inkjet printing. The resulting layer may have a thickness in the range from <5 nm to about 100 nm.

Other embodiments use materials for the thin layer, which form foams with open cell or pore structures. An example of a metal uses pores made of silver, an example of insulating material uses pores made of silica, and example of organic material uses polyurethane. These foam layers may have a thickness between about 0.5 µm and 50 µm and the pore size may vary in the range from about 5 nm to 5 µm.

DETAILED DESCRIPTION OF THE PREFERRED EMBODIMENTS

Figure 1:
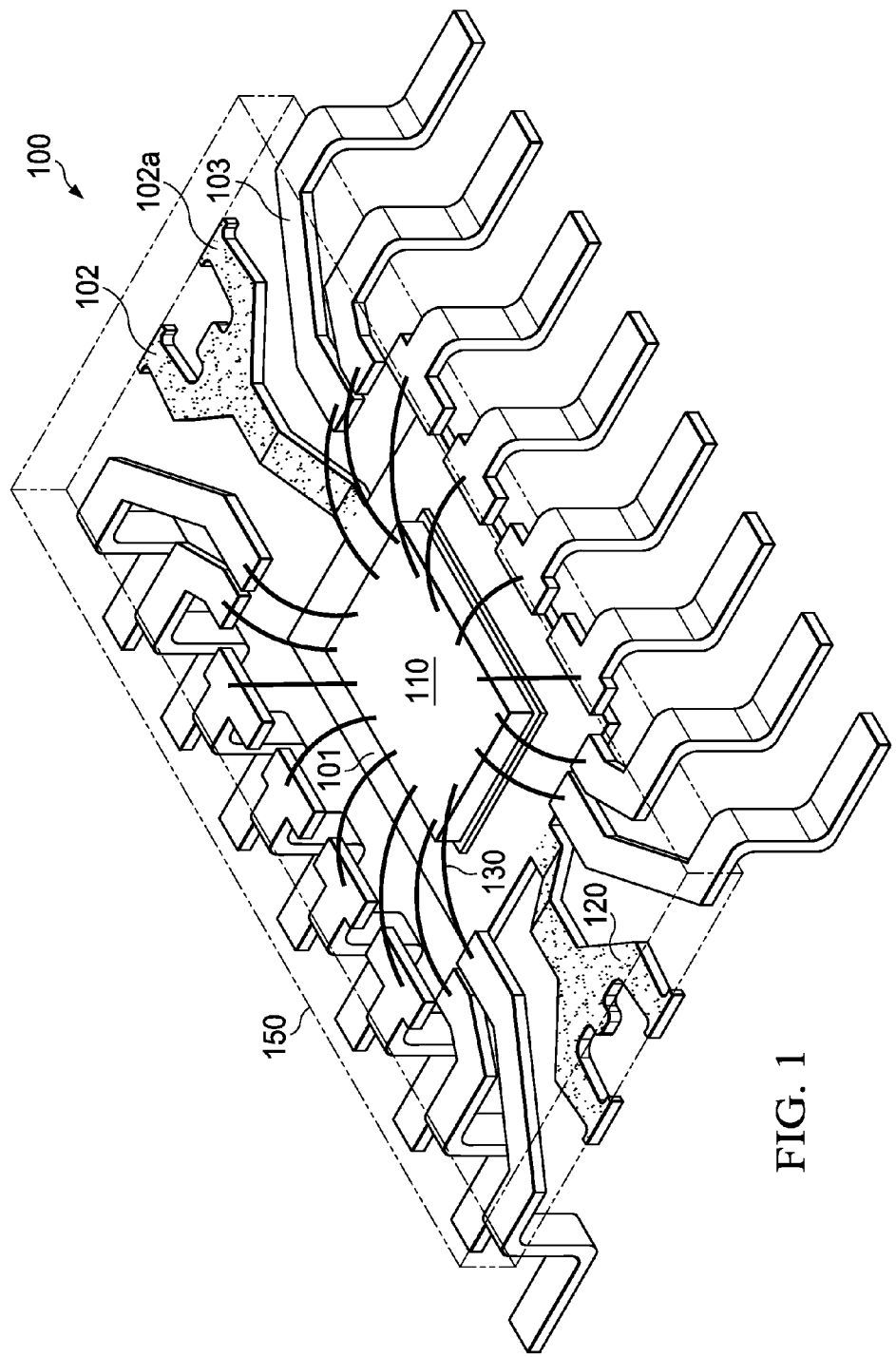
FIG. 1 shows a perspective view of a semiconductor device with a metallic leadframe and a package of transparent plastic compound; the leadframe includes assembly pad straps, which are modified according to the invention to act as pressures valves.

FIG. 1 illustrates an exemplary embodiment of the invention, a plastic packaged semiconductor device generally designated 100 with a metallic leadframe. The leadframe includes a pad 101 for assembling a semiconductor chip 110, tie bars 102 connecting pad 101 to the sidewall of the package, and a plurality of leads 103. It should be noted that herein the tie bars are referred to as straps. The chip terminals are connected to the leads 103 by bonding wires 130. In the example of FIG. 1, leads 103 are shaped as cantilevered leads; in other embodiments, the leads may have the shape of flat leads as used in Quad Flat No-Lead (QFN) devices or in Small Outline No-Lead (SON) devices. Along their longitudinal extension, straps 102 of the exemplary device in FIG. 1 include bendings and steps, since pad 101 and leads 103 are not in the same plane. In other devices, straps 102 are flat and planar, because pad 101 and leads 103 are in the same plane.

The leadframe surface onto which the chip is attached and the wire stitch bonds are welded, is designated the first surface; the opposite leadframe surface is designated the second surface.

Leadframes are preferably made from a base metal, which is selected from a group including copper, copper alloys, aluminum, aluminum alloys, iron-nickel alloys, and Kovar. For many devices, the first and second surfaces of the leadframe base metal are treated to create strong affinity for adhesion to plastic compound, especially molding compounds. As an example, the surfaces of copper leadframe may be oxidized, since copper oxide surfaces are known to exhibit good adhesion to molding compounds. Other methods include plasma treatment of the surfaces or thin layers of other metals deposited on the base metal surface.

As indicated in FIG. 1 by punctuation, at least the first surface 102a of the leadframe straps 102 of the exemplary device has a layer 120 deposited, which consists of a material both non-adhesive to polymeric compounds and hydrophobic with regard to water molecules. These two concurrent characteristics enable straps 102 to act as a valve for releasing the pressure of suddenly vaporizing water films in a harmless manner and thus to prevent a general delamination of the package from the leadframe, while generally preventing water molecules from migrating along the straps from the ambient into the package interior. Pad 101, straps 102, chip 110, wires 130, and portions of leads 103 are encapsulated in a package 150, which is preferably plastic and made of epoxy-based thermoset molding compound.

There are several choices for selecting the most effective material for layers 120. One group of suitable materials derives from fluorinated thiol compounds. These materials are selected from the family of the general configuration $$HS-(CH_2)x-(R)y-(CF_2)zCF_3,$$

wherein x may have a value from 1 to 20; y may be 0 or 1; z may have a value from 1 to 20; and R may stand for the complex —O—; —COO—; —CONH—; or —CH=CH—.

Suitable examples are represented by the following compounds:
11-(tridecafluorooctyloxy)undecanethiol, $HS-(CH_2)_{11}-O-(CH_2)_2-(CF_2)_5-CF_3$;
7,7,8,8,8-pentafluorooctanethiol, $HS-(CH_2)_6-CF_2-CF_3$;
1H,1H,2H,2H-Perfluorodecanethiol, 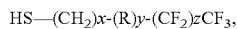 $CF_3(CF_2)_7 CH_2CH_2SH$;
3,3,4,4,5,5,6,6,6-Nonafluoro-1-hexanethiol, $CF_3(CF_2)_3 CH_2CH_2SH$.

Figure 2:
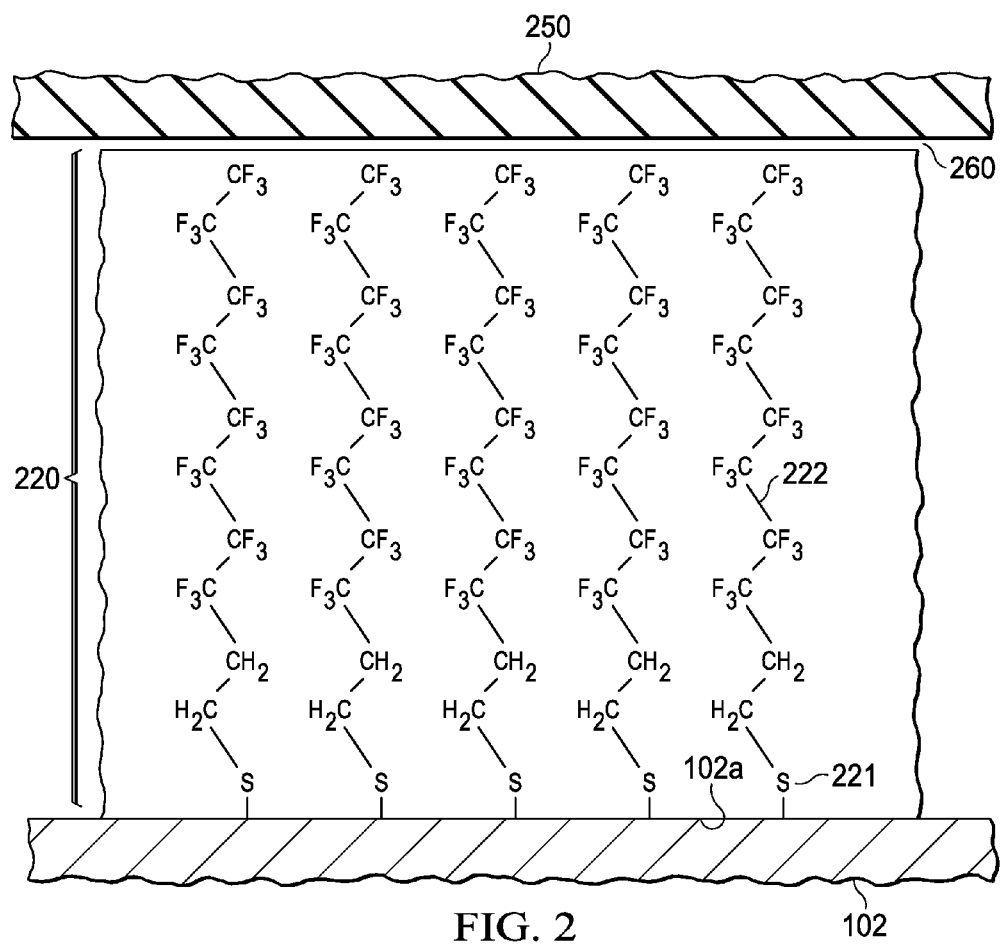
FIG. 2 illustrates a schematic cross section of a self-assembled layer of a fluorinated thiol compound attached to the surface of a leadframe strap; the layer does not adhere to the packaging compound, and is hydrophobic.

The thickness of an exemplary layer is about the thickness of a self-assembled monolayer of the selected compound. As an example, a portion of an exemplary layer 220 is depicted in FIG. 2. The figure illustrates the first surface 102a of strap 102 with attached sulphur atoms 221 of self-assembled parallel molecular chains 222 of fluorinated thiols. The layer is hydrophobic and does not adhere to the molding compound of the device package 250. The non-adherence between layer 220 and package compound 250 is indicated in FIG. 2 by the small gap 260.

Another group of suitable materials for layer 120 derive from fluorinated amine compounds. These materials are selected from the family of the general configuration

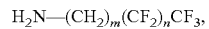
$$H_2N-(CH_2)_m(CF_2)_nCF_3,$$

Wherein m may have a value from 1 to 20; and n may have a value from 1 to 20.

Yet another group of suitable materials for layer 120 derive from fluorinated aminesilane compounds. A preferred example is represented by the following compound:

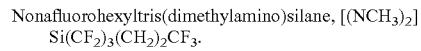
Nonafluorohexyltris(dimethylamino)silane, $[(NCH_3)_2] Si(CF_2)_3(CH_2)_2CF_3$.

Yet another group of suitable materials for layer 120 derive from organosilanes and their derivatives.

Preferred methods of coating straps 102 with the above mentioned materials include aerosol jet printing and inkjet printing. The method of aerosol jet printing is especially preferred.

Figure 3:
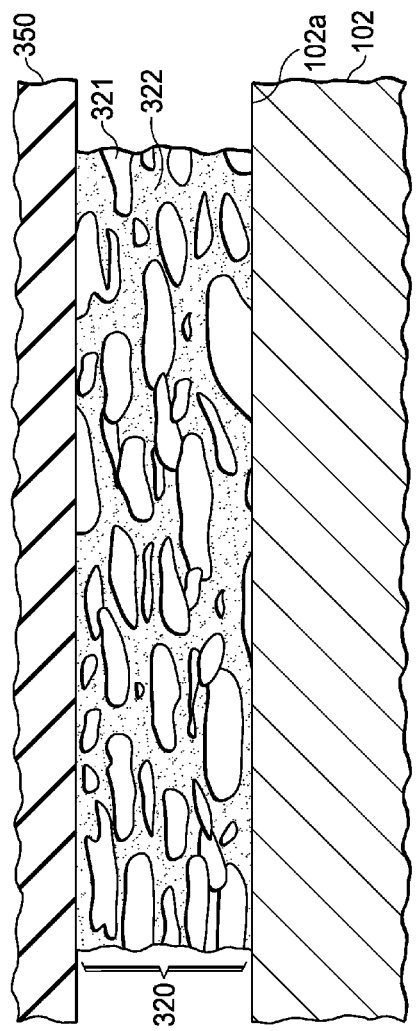
FIG. 3 depicts a schematic cross section of a layer of open-pore cellular material containing approximately spherical pores connected with one another through windows; exemplary materials of the layer include silver, silica, and polyurethane.

FIG. 3 depicts another embodiment of a layer on straps 102, which is both non-adhesive to polymeric packaging compounds, and hydrophobic. Attached to first surface 102a of strap 102 is a layer 320 made of an open-pore microcellular foam. With its open cell structure, layer 320 adheres to surface 102a and also has good adhesion to packaging compound 350. It should be noted that the open-pore microcellular foam may also be applied on the strap surface opposite surface 102a. The open-pore structure of the layer 220 acts as an absorbent in case of a rapid pressure increase of water vapor. The thickness of layer 320 may be selected in the range from about 0.5 µm to 50 µm, with the preferred thickness in the range from about 2 µm to 20 µm. The 3-dimensional structure of the foam includes approximately spherical pores 321 and other pores with irregular and even cornered pores. The skeletal structure 322 may be metallic or it may be polymeric. Preferred metals include silver and silver alloys, preferred polymeric materials include inorganic silica, and silane derivatives.

The pore size depends on the material selected; it may be in the range from about 5 nm to 5 µm, with preferred pore sizes in the range from about 0.5 µm to 2 µm.

Figure 4:
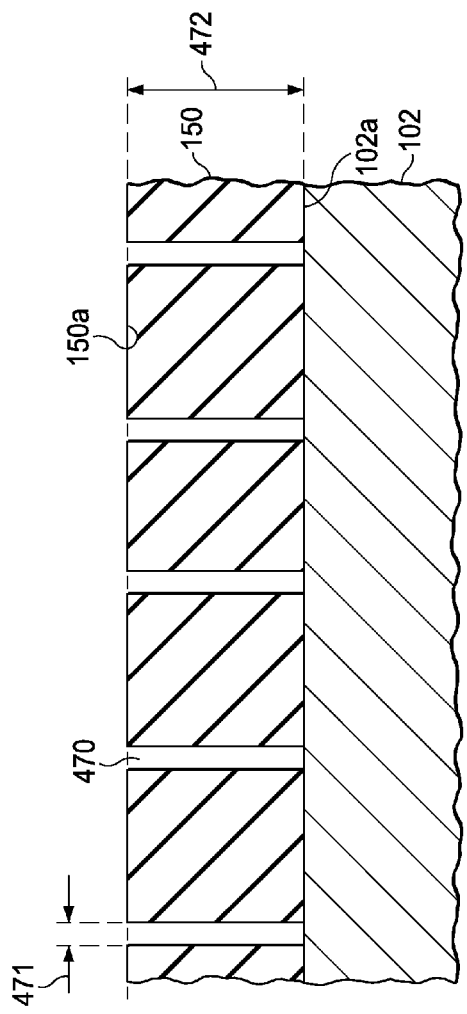
FIG. 4 shows a cross section through a portion of a leadframe strap encapsulated by a packaging compound with an array of vertical through-holes from the device surface to the strap surface, according to the invention.

Another embodiment of the invention is an outlet of water vapor pressure through micro-holes. An example is illustrated in FIG. 4. It shows a portion of a packaged semiconductor device, which includes a leadframe with an assembly pad, a plurality of straps connecting the pad to side edges of the device package, and a plurality of leads; a semiconductor chip is attached to the pad and connected by wires to respective leads. The device has a package, preferably made of a plastic compound, which encapsulates the pad, the straps, the chip, and the wires. In FIG. 4, a portion of a strap 102 is depicted together with the package compound 150 over the surface 102a of the strap.

As exemplary FIG. 4 shows, package 150 has an array of holes 470 through the plastic compound (Through Mold Via, TMV, technology). In other devices, there may only be a single hole or only a few holes. The array follows the lateral extension of strap 102. The holes extend for a length 472 from the surface 102a of strap 102 to the surface 150a of the plastic package; the preferred orientation of the holes is vertically above the strap. The methodology is sometimes referred to as through mold via (TMV) technology.

The holes have a diameter 471 in the range from about 10 µm to 500 µm. The preferred range of hole diameters 471 is from about 20 µm to 100 µm. While some devices have only a single hole or a couple of holes, an effective array of hole numbers from 2 to 20. Preferably, a leadframe strap of plastic encapsulated devices has an array of holes numbered from 4 to 8. In other devices, the holes may be placed in an irregular fashion, since the most effective pattern of holes depends on the design of the leadframe.

The preferred method of drilling the holes through the package material is laser drilling. However, arrays of very fine steel drills may also be used; such fine drills have recently been developed for MEMS fabrication and can be successfully employed for holes as in exemplary FIG. 4.

It should be stressed that the structural considerations discussed above and the method described below hold not only for plastic packaged devices with metallic leadframes, but also for packaged devices with other kinds of substrates and package materials. For example, substrates may be multilayer laminated substrates, or foil-type substrates. Packaging materials may include compounds which allow gradual penetration by water molecules from the ambient to the assembly inside.

Another embodiment of the invention are methods for fabricating packaged semiconductor devices with features operable as valves or outlets for water vapor under pressure. In one of the methods, the process flow starts by providing a leadframe with an assembly pad, one or more straps connecting the pad to the frame, and a plurality of leads. All entities having a first and a second surface. The leadframes are fabricated of a base metal suitable to have surfaces with affinity for adhering to polymeric compounds.

In preparing the leadframe, a layer of a compound is deposited onto one or both surfaces of the straps or other parts of the leadframe (preferably not involved in electrical operation), wherein the compound is both non-adhesive to the package compound and hydrophobic.

Among the preferred methods for forming open-pore layers are particle-based low temperature sintering techniques, which utilize space-holders as pore forming materials. An example for particles are metallic particles such as silver, and examples for space-holders are bicarbonate particles and sodium chloride particles. After completing the layer formation by sintering, the space-holders are removed by dissolution using water. These layer forming techniques can be applied to create the porous structures on one or both leadframe surfaces of the straps.

Next, a semiconductor chip (in some instances, a plurality of chips) is assembled on the pad. The chip terminals are connected by bonding wires to respective leads. In the next process, the pad, the chip, and the wires are encapsulated in a package of a material, which may not be fully hermetic against water molecules; an example is an epoxy-based plastic transfer molding compound. The material adheres to the leadframe base metal but does not adhere to the deposited layer on the straps.

For some devices, the material of the layer deposited on the straps is selected from a group, which includes fluorinated thiol compounds, fluorinated amine compounds, fluorinated aminesilanes, organosilanes, and their derivatives. For other devices, the compound of the layer deposited on the straps is selected from a group, which includes open-pore microcellular metal foams (for instance, silver) and open-pore microcellular inorganic foams (for instance, silica) and polymeric foams.

It should be noted that the layers of compounds, which are both non-adhesive to polymeric materials and hydrophobic, especially the open-pore foam compounds, may be deposited one or both surfaces of the leadframe straps.

In another of the methods, the process flow starts by providing a leadframe with an assembly pad, one or more straps connecting the pad to the frame, and a plurality of leads. All entities having a first and a second surface. The leadframes are fabricated of a base metal suitable to have surfaces with affinity for adhering to polymeric compounds.

Next, a semiconductor chip (in some instances, a plurality of chips) is assembled on the pad. The chip terminals are connected by bonding wires to respective leads. In the next process, the pad, the chip, and the wires are encapsulated in a package of a material, which may not be fully hermetic against water molecules, such as an epoxy-based plastic transfer molding compound. The material adheres to the leadframe base material.

After the process of hardening (polymerizing) the package compound, one or more holes are drilled through the plastic compound so that the holes extend from the package surface to the surface of the strap vertically below the package surface (through mold via, TMV, methodology). The holes may be in an orderly array, or they may be in arbitrary locations.

It is effective for some devices to combine the methodologies of TMV and open-pore layers.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to active semiconductor devices with low and high pin counts, such as transistors and integrated circuits, but also to combinations of active and passive components on a leadframe pad.

As another example, the invention applies not only to silicon-based semiconductor devices, but also to devices using gallium arsenide, gallium nitride, silicon germanium, and any other semiconductor material employed in industry.

As another example, the invention applies to leadframe pads, which have two or more pad straps (tie bars). As yet another example, the invention applies to pads straps, which are offset from the plane of the leadframe, and to pads straps, which are co-planar with the plane of the leadframe.

It is therefore intended that the appended claims encompass any such modifications or embodiments.

We claim:

1. A leadframe comprising:
    a frame, an assembly pad, straps connecting the pad to the frame, and a plurality of leads, all entities having a first and a second surface;
    the leadframe made of a base metal suitable to have surfaces with affinity for adhering to polymeric compounds; and
    at least one surface of the straps covered with a layer of a compound both non-adhesive to polymeric compounds and hydrophobic.

2. The leadframe of claim 1 wherein the leads are selected from a group including cantilevered leads and Quad Flat No-Lead/Small Outline No-Lead (QFN/SON) type leads.

3. The leadframe of claim 2 wherein the strap is selected from a group including planar straps and straps having steps and bends.

4. The leadframe of claim 3 wherein the base metal is selected from a group including copper, copper alloys, aluminum, aluminum alloys, iron-nickel alloys, and Kovar.

5. The leadframe of claim 4 wherein the compound of the layer covering the straps is selected from a group including fluorinated thiol compounds, fluorinated amine compounds, fluorinated aminesilanes, organosilanes, and their derivatives.

6. The leadframe of claim 5 wherein the thickness of the layer is the thickness of a self-assembled monolayer of the selected compound.

7. The leadframe of claim 5 wherein the fluorinated thiol compounds are selected from the family of the general configuration HS—$(CH_2)x$-$(R)y$-$(CF_2)zCF_3$, wherein x may have a value 1 to 20; y may be 0 or 1; z may have a value 1 to 20; and R may stand for the composition —O—; —COO—; —CONH—; or —CH=CH—.

8. The leadframe of claim 5 wherein the fluorinated amine compound are selected from the family of the general configuration $H_2N$—$(CH_2)_m(CF_2)_nCF_3$, wherein m may have a value 1 to 20; and n may have a value 1 to 20.

9. The leadframe of claim 5 wherein the fluorinated aminesilane has the composition $[(NCH_3)_2]Si(CF_2)_3(CH_2)_2CF_3$.

10. The leadframe of claim 4 wherein the compound of the layer covering the straps is selected from a group including open-pore microcellular metal foams and open-pore microcellular polymer foams.

11. The leadframe of claim 10 wherein the average pore diameters of the microcellular material covering a certain strap are in the range from about 5 nm to 5 μm.

12. The leadframe of claim 10 wherein the thickness of the layer is in the range from about 0.5 μm to 50 μm.

13. A packaged semiconductor device comprising:
a leadframe having an assembly pad, a plurality of straps connecting the pad to side edges of the device package, and a plurality of leads;
the leadframe made of a base metal with affinity for adhering to polymeric compounds;
at least one surface of the straps covered with a layer of a compound both non-adhesive to polymeric compounds and hydrophobic;
a semiconductor chip assembled on the pad and connected by wires to respective leads; and
a package of a plastic compound encapsulating the pad, straps, chip, and wires, wherein the plastic compound adheres to the leadframe base metal but not to the layer on the straps.

14. The device of claim 13 wherein the compound of the layer covering the straps is selected from a group including fluorinated thiol compounds, fluorinated amine compounds, fluorinated aminesilanes, organosilanes, and their derivatives.

15. The device of claim 13 wherein the compound of the layer covering the straps is selected from a group including open-pore microcellular metal foams and open-pore microcellular polymer foams.

16. A packaged semiconductor device comprising:
a leadframe having an assembly pad, a plurality of straps connecting the pad to side edges of the device package, and a plurality of leads;
a semiconductor chip assembled on the pad and connected by wires to respective leads;
a package of a plastic compound encapsulating the pad, straps, chip, and wires; and
an array of holes through the plastic compound, the holes extending from the surface of a strap to the package surface vertically above the strap.

17. The device of claim 16 wherein the plastic compound is a molding compound.

18. The device of claim 16 wherein the holes have a diameter in the range from about 10 μm to 500 μm.

19. The device of claim 18 wherein the number of holes in an array is in the range from about 2 to 20.

20. A method for fabricating a packaged semiconductor device comprising:
providing a leadframe having an assembly pad, straps connecting the pad to the frame, and a plurality of leads, all entities having a first and a second surface, the leadframe made of a base metal suitable to have surfaces with affinity for adhering to polymeric compounds;
depositing a layer of a compound onto at least one surface of the straps, the compound being both non-adhesive to polymeric compounds and hydrophobic;
assembling a semiconductor chip on the pad and connecting the chip by wires to respective leads; and
encapsulating the pad, straps, chip, and wires in a package of a plastic compound, wherein the plastic compound adheres to the leadframe base metal but not to the layer on the straps.

21. The method of claim 20 wherein the compound of the layer covering the straps is selected from a group including fluorinated thiol compounds, fluorinated amine compounds, fluorinated aminesilanes, organosilanes, and their derivatives.

22. The method of claim 20 wherein the compound of the layer covering the straps is selected from a group including open-pore microcellular metal foams and open-pore microcellular polymer foams.

23. A method for fabricating a packaged semiconductor device comprising:
providing a leadframe having an assembly pad, straps connecting the pad to the frame, and a plurality of leads, all entities having a first and a second surface, the leadframe made of a base metal suitable to have surfaces with affinity for adhering to polymeric compounds;
assembling a semiconductor chip on the pad and connecting the chip by wires to respective leads;
encapsulating the pad, straps, chip, and wires in a package of a plastic compound; and
drilling an array of holes through the plastic compound, the holes extending from the package surface to the surface of a strap vertically below the package surface.

* * * * *